(12) United States Patent
Chuang et al.

(10) Patent No.: US 8,105,929 B2
(45) Date of Patent: *Jan. 31, 2012

(54) GATE CONTROL AND ENDCAP IMPROVEMENT

(75) Inventors: Harry Chuang, Hsin-Chu (TW); Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 52 days.

This patent is subject to a terminal disclaimer.

(21) Appl. No.: 12/193,538

(22) Filed: Aug. 18, 2008

(65) Prior Publication Data

US 2008/0305599 A1 Dec. 11, 2008

Related U.S. Application Data

(63) Continuation of application No. 11/012,414, filed on Dec. 15, 2004, now Pat. No. 7,432,179.

(51) Int. Cl.
*H01L 21/38* (2006.01)

(52) U.S. Cl. . 438/551; 438/666; 438/917; 257/E21.444; 257/E21.453

(58) Field of Classification Search .......... 438/197, 438/201, 299, 531, 551, 552, 553, 585, 666, 438/714, 717, 734, 736, 751; 257/41, 281, 257/282, E21.444, E21.543
See application file for complete search history.

(56) References Cited

U.S. PATENT DOCUMENTS

| | | | |
|---|---|---|---|
| 5,598,010 A * | 1/1997 | Uematsu | 257/48 |
| 5,686,338 A | 11/1997 | Liu | |
| 5,923,969 A * | 7/1999 | Oyamatsu | 438/183 |
| 6,074,938 A | 6/2000 | Asamura | |
| 6,103,592 A | 8/2000 | Levy et al. | |
| 6,153,919 A | 11/2000 | Sjödin et al. | |
| 6,287,904 B1 * | 9/2001 | Lee et al. | 438/197 |
| 6,461,906 B1 | 10/2002 | Lung | |
| 6,492,073 B1 | 12/2002 | Lin et al. | |
| 6,787,469 B2 | 9/2004 | Houston et al. | |
| 6,944,844 B2 * | 9/2005 | Liu | 716/19 |
| 7,432,179 B2 * | 10/2008 | Chuang et al. | 438/551 |
| 2002/0160590 A1 | 10/2002 | Hashimoto et al. | |
| 2004/0092089 A1 * | 5/2004 | Thakar et al. | 438/585 |
| 2004/0099924 A1 * | 5/2004 | Nakata et al. | 257/510 |
| 2008/0171406 A1 | 7/2008 | Orimoto et al. | |
| 2009/0315079 A1 | 12/2009 | Tien et al. | |
| 2010/0159685 A1 | 6/2010 | Chuang et al. | |

FOREIGN PATENT DOCUMENTS

JP 2002-270538 9/2002

OTHER PUBLICATIONS

Auth, C., et al., "45nm High-k+Metal Gate Strain-Enhanced Transistors," Intel® Technology Journal, vol. 12, Issue 2, Jun. 17, 2008, 12 pages.

* cited by examiner

*Primary Examiner* — William D Coleman
*Assistant Examiner* — Su Kim
(74) *Attorney, Agent, or Firm* — Slater & Matsil, L.L.P.

(57) ABSTRACT

A method of forming semiconductor structures comprises following steps. A gate dielectric layer is formed over a substrate in an active region. A gate electrode layer is formed over the gate dielectric layer. A first photo resist is formed over the gate electrode layer. The gate electrode layer and dielectric layer are etched thereby forming gate structures and dummy patterns, wherein at least one of the dummy patterns has at least a portion in the active region. The first photo resist is removed. A second photo resist is formed covering the gate structures. The dummy patterns unprotected by the second photo resist are removed. The second photo resist is then removed.

15 Claims, 8 Drawing Sheets

GATE CONTROL AND ENDCAP IMPROVEMENT

This application is a continuation of U.S. patent application Ser. No. 11/012,414, filed Dec. 15, 2004, now U.S. Pat. No. 7,432,179 and entitled "Controlling Gate Formation by Removing Dummy Gate Structures," which application is hereby incorporated herein by reference.

TECHNICAL FIELD

This invention relates to semiconductor devices, specifically to the gate critical dimension control and endcap improvement through use of dummy patterns.

BACKGROUND

The existence of pattern effect in films has been well known. There is a problem that a "micro-loading effect" occurs due to a difference in pattern density and degrades the uniformity of pattern sizes. The "micro-loading effect" pertains to a phenomenon occurring upon simultaneously etching or polishing a pattern of a higher density and a pattern of a lower density. Due to a difference in the etching/polishing rate of a film from one location to another, the amount of reaction produced by the etching/polishing becomes locally dense or sparse, and the convection of a large amount of reaction products by etching with a low volatility causes a non-uniformity in the etching rate. Large variations in effective pattern density have been shown to result in significant and undesirable effects such as pattern dimension deviation and thickness variation.

To counteract this effect, a layout design step known as dummy fill, where the circuit layout is modified and dummy patterns are added to locations with low pattern density, was developed. The adding of dummy patterns helps to achieve uniform effective pattern density across the wafer, therefore avoiding problems.

Conventionally, such dummy patterns are left in place. In the case dummy patterns are conductive, they form parasitic capacitance with the interlayer metal wiring. The parasitic capacitance contributes to the RC time delay due to charging and discharging time. The scaling scheme of ILD and higher operation frequency for advanced process will cause severe performance degradation due to unwanted parasitic capacitance. At the present stage of the development of the integrated circuit art, there is an increasing demand in the field of digital integrated circuits for faster switching circuits. As with the switching demands of the integrated circuits go into higher frequency, the slowing effect produced by parasitic capacitance becomes an increasing problem.

Since dummy patterns are not removed, they cannot be formed in an active region, or oxide defined (OD) region. Leftover dummy patterns not only increase parasitic capacitance and degrade device performance, but also affect the subsequent processes. One of the conventional solutions is to place dummy patterns surrounding, but not in, the active regions. Not being able to be placed in desired regions, the effect of the dummy patterns is significantly limited. Such an arrangement also increases the difficulty of fine-tuning the dummy patterns. There were also efforts made to put dummy patterns into dummy active regions, or regions having neither an oxide nor an active device. However, the results have generally not proven satisfactory.

There is another effect that also affects the semiconductor process. When two devices are too close to each other, optical proximity effects occur. Optical proximity effects are due to light diffraction and interference between closely spaced features on the reticle resulting in the widths of lines in the lithographic image being affected by other nearby features. One component of the proximity effect is optical interaction among neighboring features; other components arise from similar mechanisms in the resist and etch processes.

The micro-loading and proximity effects affect the gate formation of the MOS devices. The critical dimension, or the gate length of a MOS device, may deviate significantly from design. For example, if an 80 nm gate length is desired, when the critical dimension of a MOS device in a dense device area is on target at 80 nm, the critical dimension of a MOS device in an isolated device area may reach around 110 nm, or 30 nm more than the target value in certain cases. Also the deviations for nMOS and pMOS gates are different, causing N/P ratio mismatching and complicating circuit design.

Figure 1:
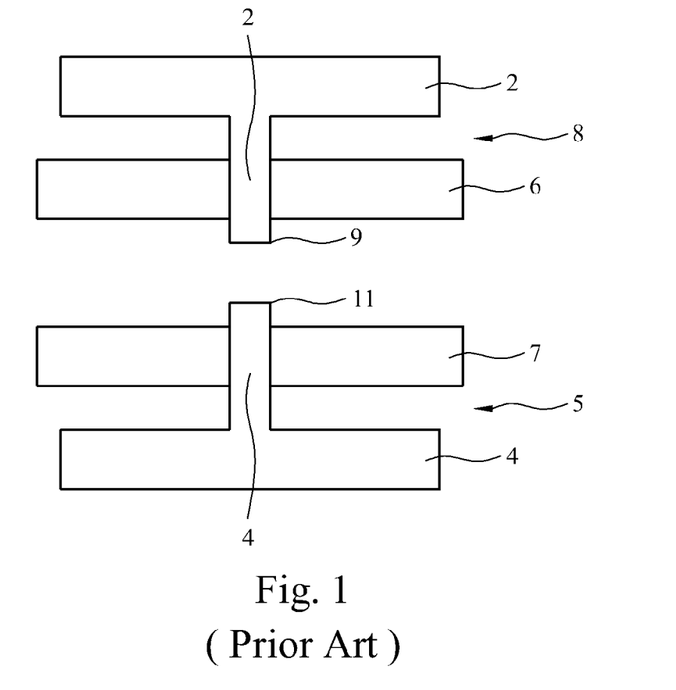
FIG. 1 illustrates a top view of a conventional semiconductor structure having endcaps of MOS devices next to each other.
Figure 2:
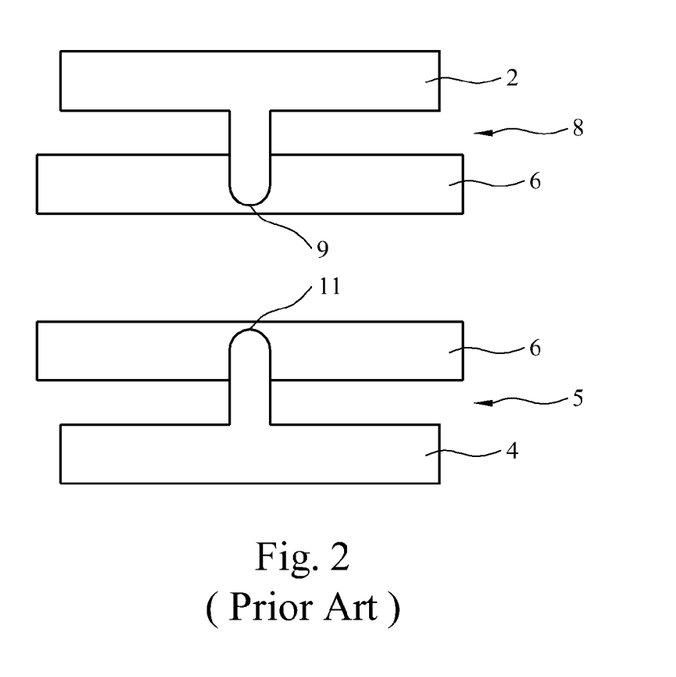
FIG. 2 illustrates a top view of a conventional semiconductor structure having endcaps of MOS devices next to each other, the endcaps are recessed into the active regions.

Lack of process control in gate formation also causes endcap problems. FIG. 1 illustrates a conventional layout comprising two MOS devices. Gate 2 and active region 6 form a first device 8. Gate 4 and active region 7 form a second device 5. Gates 2 and 4 have endcaps 9 and 11 respectively, extending outside active regions 6 and 7. Due to the micro loading or proximity effects, endcaps 9 and 11 may be longer or shorter than designed. When endcaps 9 and 11 are longer than designed, poly gates 2 and 4 may be shortened, causing device failure. Conversely, problems may also occur if endcaps 9 and 11 are shorter than designed, as shown in FIG. 2. If endcap 9 or 11 is recessed into the active region 6 or 7, it cannot effectively control the channel of the device and shut off the MOS device. As a consequence, a significant leakage current may exist between the source and drain of devices 8 and 5.

SUMMARY OF THE INVENTION

The preferred embodiment of the present invention presents a method of using dummy patterns for gate critical dimension control and endcap improvement.

In accordance with one aspect of the present invention, a gate dielectric layer is formed over a substrate having an active region. A gate electrode layer is formed over the gate dielectric layer. A first photo resist is formed over the gate electrode layer. The first photo resist is exposed and developed. The gate electrode layer and dielectric layer are etched, thereby forming gate structures and dummy patterns, wherein at least a portion of at least one of the dummy patterns is in the active region. The first photo resist is removed. A second photo resist is formed covering the gate structures and leaving out the dummy patterns. The dummy patterns unprotected by the second photo resist are removed.

In accordance with another aspect of the present invention, two closely located MOS devices are formed. The endcaps of the MOS devices are next to each other. When forming gate structures and dummy patterns, the gate structures are interconnected. A second photo resist having a gap between the first gate structure and the second gate structure is formed covering the gate structures. The dummy patterns unprotected by the second photo resist are etched. The unprotected gate structure is also etched so that the gate structures are disconnected. This preferred embodiment of the present invention has well-controlled endcaps.

By using preferred embodiments of the present invention, the critical dimensions of the MOS devices are controlled. Bridging and line end shortening are avoided. Due to more accurate device dimensions with respect to design, N/P ratios are more controllable without the need for complicated fine tune techniques such as optical proximity correction (OPC). Therefore, the overall chip speed and performance are improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 through 9 are cross-sectional views and top views of intermediate stages in the manufacture of a MOS transistor embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 3 through 12 wherein like reference numbers are used to designate like elements throughout the various views and illustrative embodiments of the present invention. Each figure number may be followed by a letter A or B, where A indicates that the figure is a cross sectional view and B indicates a corresponding top view of the figure whose numbers have an "A" as suffix.

Figure 3:
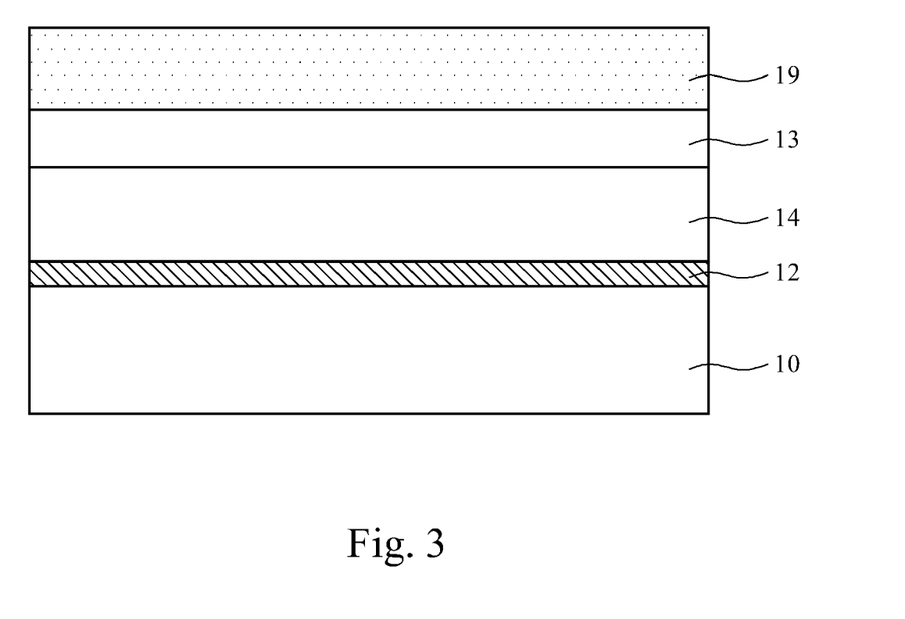

FIGS. 3 through 9 are cross-sectional views and top views of intermediate stages in the manufacture of a gate structure of a MOS transistor embodiment. FIG. 3 illustrates stack layers formed on a substrate 10. Substrate 10 comprises active regions on which MOS devices can be formed. Typically, the boundaries of active regions are defined by oxides such as shallow trench isolations. Depending on where an active region is located, a non-oxide region may be referred as either an active region, which has active devices formed therein, or a dummy active region, which has no active devices formed therein. A gate dielectric layer 12 is formed over the substrate 10. Gate dielectric layer 12 may be formed of thermal oxidation or other methods. Gate dielectric layer 12 may comprise $SiO_2$, oxynitride, nitride and high-k materials. A gate electrode layer 14 is formed on the gate dielectric layer 12. Gate electrode 14 is preferably polysilicon, although it may also be metal or metal compound comprising titanium, tungsten, cobalt, aluminum, nickel or combinations thereof.

Figure 4:
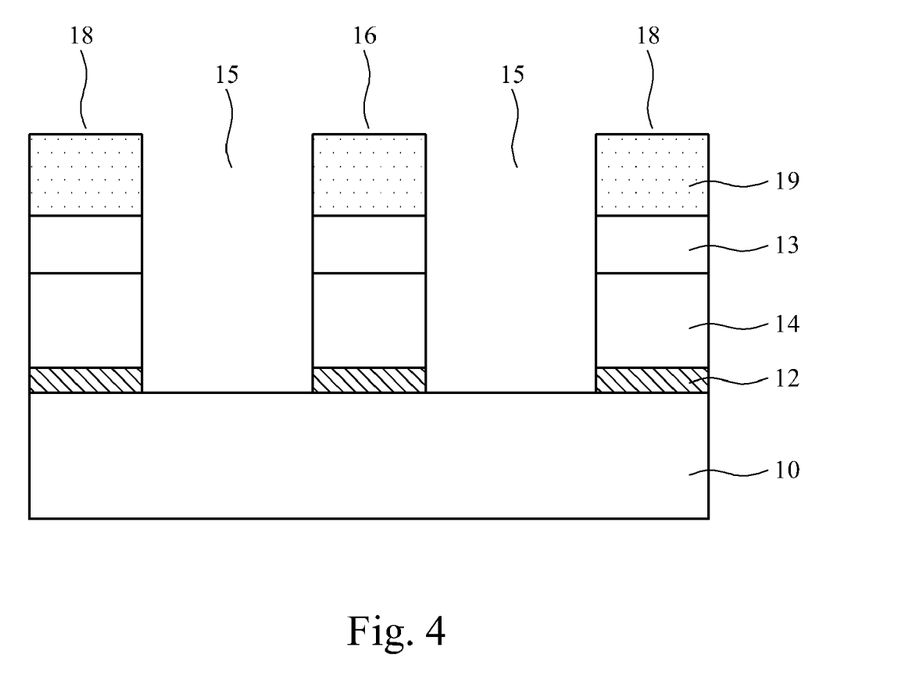

FIG. 3 also illustrates a photo resist 19 formed over the electrode 14. Since the gate dimensions are critical, an anti-reflective coating (ARC) 13 is preferably formed. FIG. 4 illustrates a bottom anti-reflective coating (BARC) 13 that is formed under the photo resist 19. In alternative embodiments, a top anti-reflective coating (TARC) may also be formed on top of the photo resist 19. ARC 13 absorbs light and provides ultimate critical dimension control. The material of the BARC 13 depends on the material of the photo resist 19 and may be organic materials or in-organic materials, such as $SiO_xN_y$, and SiN formed of low-pressure chemical vapor deposition (LPCVD) or plasma-enhanced chemical vapor deposition (PECVD), and oxide. A person skilled in the art will recognize the right combination of the photo resist 19 and suitable ARC 13 materials. BARC 13 can be applied using a spin on technique or by deposit in a gas chamber.

FIG. 4 illustrates formation of gate structure 16 and dummy patterns 18. Openings 15 are formed in photo resist 19 and BARC 13. The process suitable for forming such openings depends on the materials of the photo resist 19 and BARC 13. In the preferred embodiment, BARC 13 is organic and developer soluble, thus photo resist 19 and BARC 13 can be exposed and developed in one process. In other embodiments, either BARC 13 is inorganic or developer insoluble, and a two-step process is performed. The photo resist 19 is exposed and developed first, and BARC 13 is then removed from the openings in the photo resist 19 and thus openings 15 are formed. Exposed gate electrode layer 14 and dielectric layer 12 are then etched through the openings 15, forming gate stack 16 and dummy patterns 18. Both gate 16 and dummy patterns 18 include a gate oxide layer 12, a gate electrode 14 and a BARC 13. The method of etching gate electrode layer 14 and dielectric layer 12 is well known in the art.

Figure 5A:
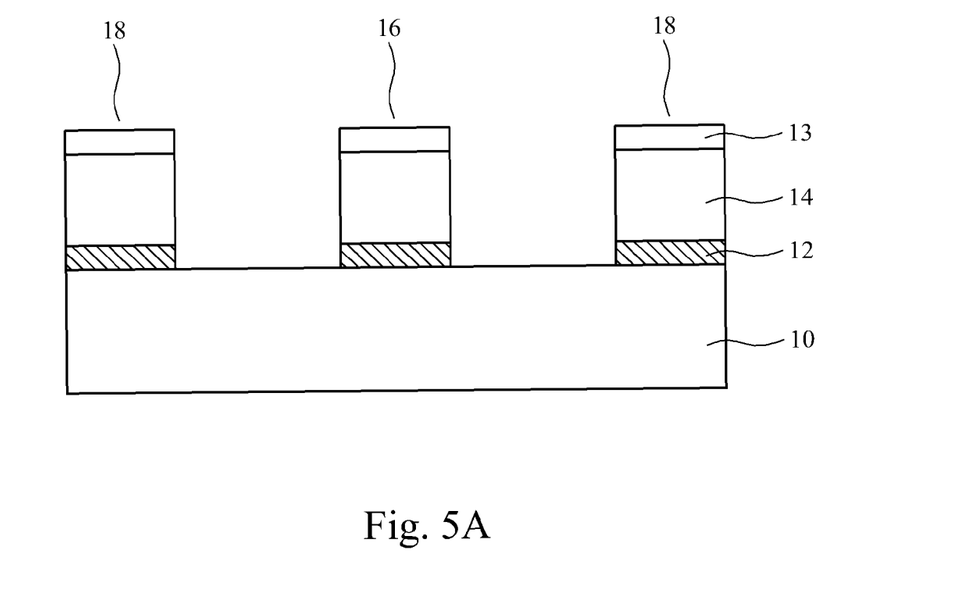
Figure 5B:
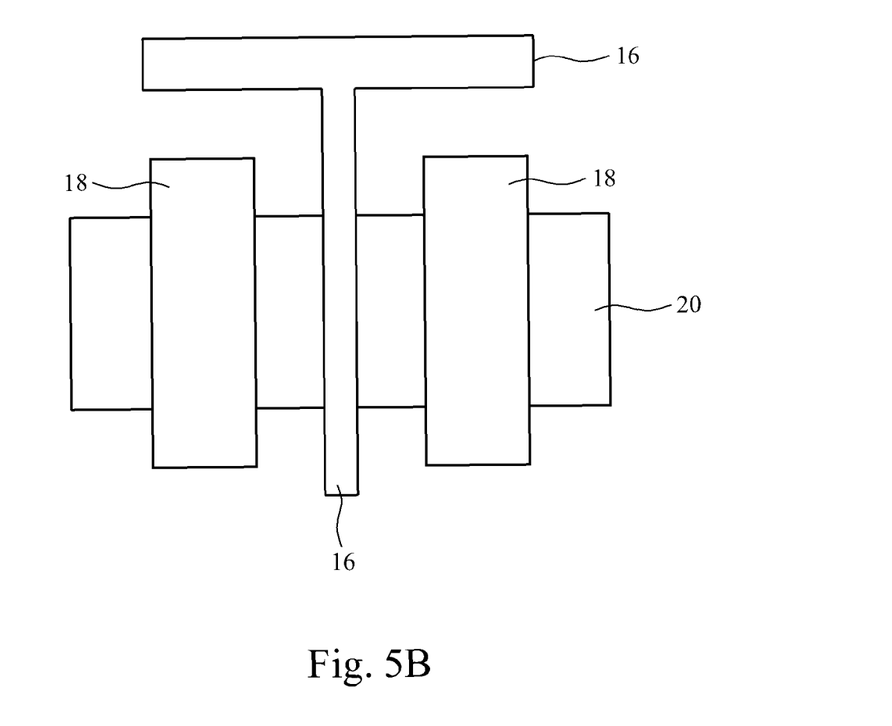

Photo resist 19 is then striped or etched, forming a structure shown in FIG. 5A. FIG. 5B illustrates a top view of the structure in FIG. 5A. At least one of the dummy patterns 18 has a portion formed on the active region 20. Since the dummy patterns 18 can be formed in the active region, it is significantly easier to arrange the dummy patterns so that the effective device density is substantially uniform throughout a chip. The results have shown that the micro-loading effect is effectively reduced by the preferred embodiment. Typically, in the after development inspection, the deviation of the critical dimension is less than about 2 nm, which means when the target critical dimension is 80 nm, the resulting critical dimension is between about 78 nm to about 82 nm.

For clarity, only two dummy patterns are shown in FIG. 5B. In an actual design, the number of dummy patterns and the spacing between dummy patterns will change and can be generated and fine tuned by a dummy utility system. Since nMOS and pMOS devices react differently to micro-loading effects, the spacing between the dummy patterns in an nMOS region and a pMOS region can be different. Non-uniform spacing can further increase the accuracy of the critical dimension and lower the deviations.

The preferred embodiment discussed above illustrates one of the methods for forming gate structures. Other methods may also be used in alternative embodiments. If lithography, etching, or CMP are involved, micro-loading effects occur and dummy patterns are preferably formed. It is preferred that dummy patterns are formed of the same material as the gate electrode.

Figure 6A:
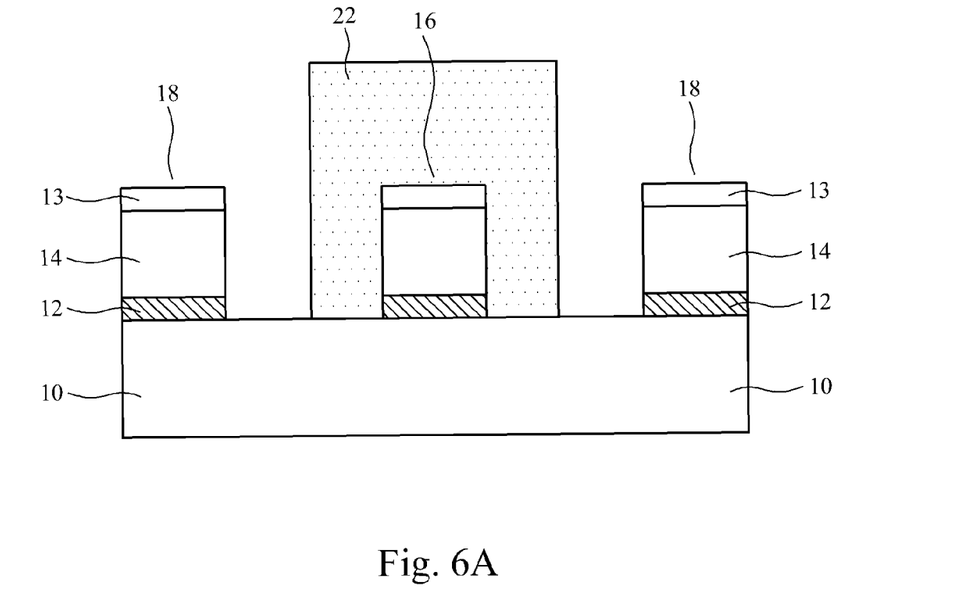
Figure 6B:
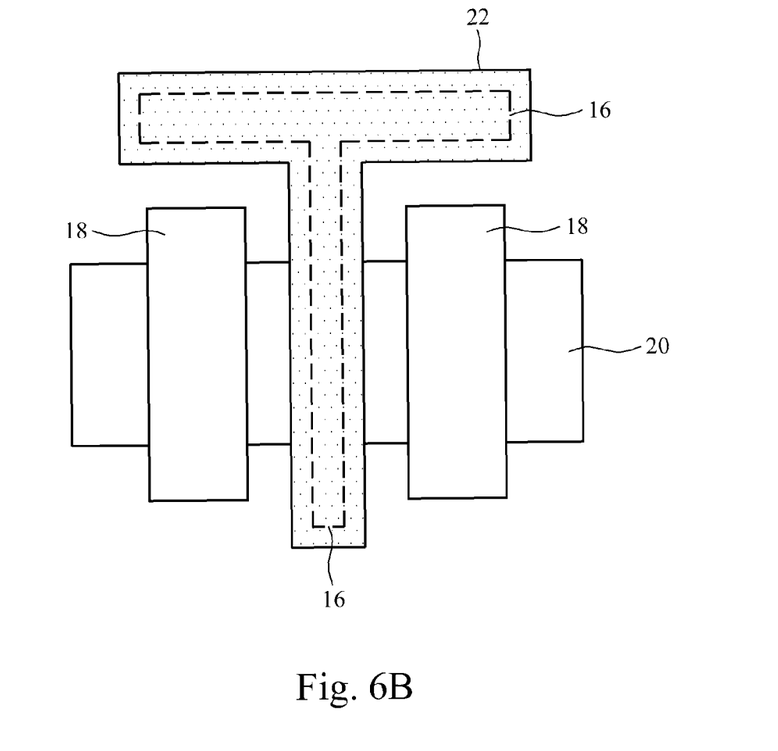

Dummy patterns 18 are then removed since they affect the subsequent processes and otherwise may cause device performance degradation. FIG. 6A illustrates a photo resist 22 formed covering the gate structure 16. It is preferred that photo resist 22 extends beyond gate structure 16 for between about 10 nm and about 150 nm so that it is guaranteed that the gate structure 16 is completely covered. The purpose of the photo resist 22 is to protect the gate structure when dummy patterns 18 are removed. Therefore the dimension and alignment of photo resist 22 are not critical as long as it protects gate structure 16 without covering dummy patterns 18. FIG. 6B illustrates a top view of the structure illustrated in FIG.

6A. As shown, gate structure 16 is covered completely and dummy patterns 18 are left uncovered.

Dummy patterns 18 are then etched. Since the gate structure 16 is completely protected by photo resist 22, it is not etched and the dimensions created in the previous forming steps are preserved.

Figure 7A:
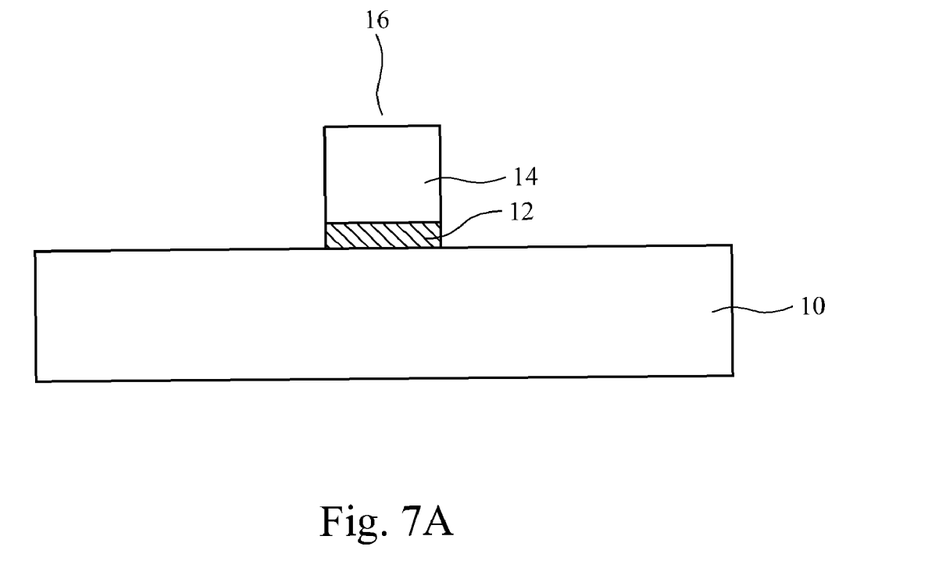
Figure 7B:
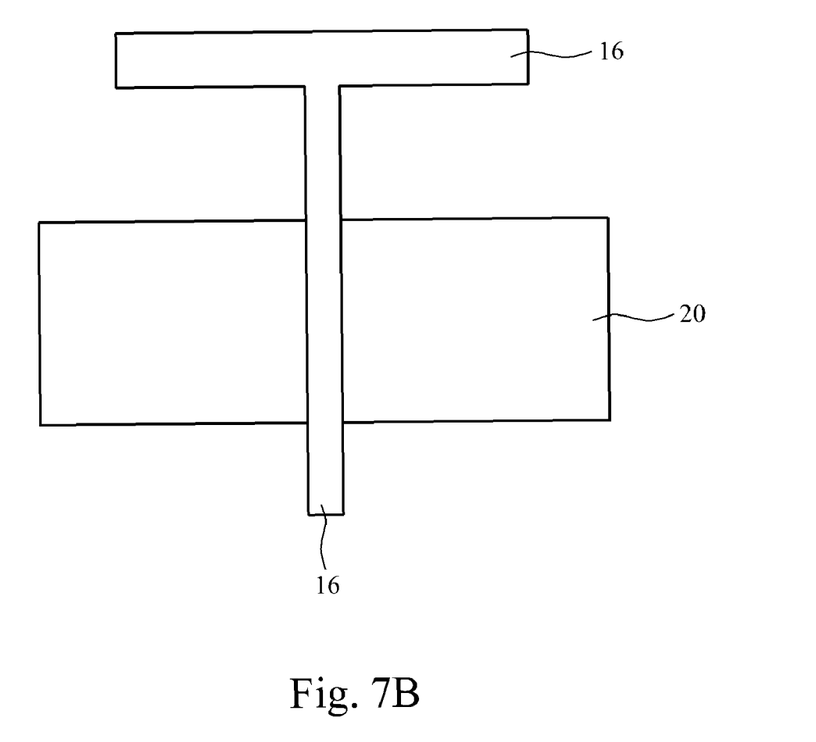
Figure 8:
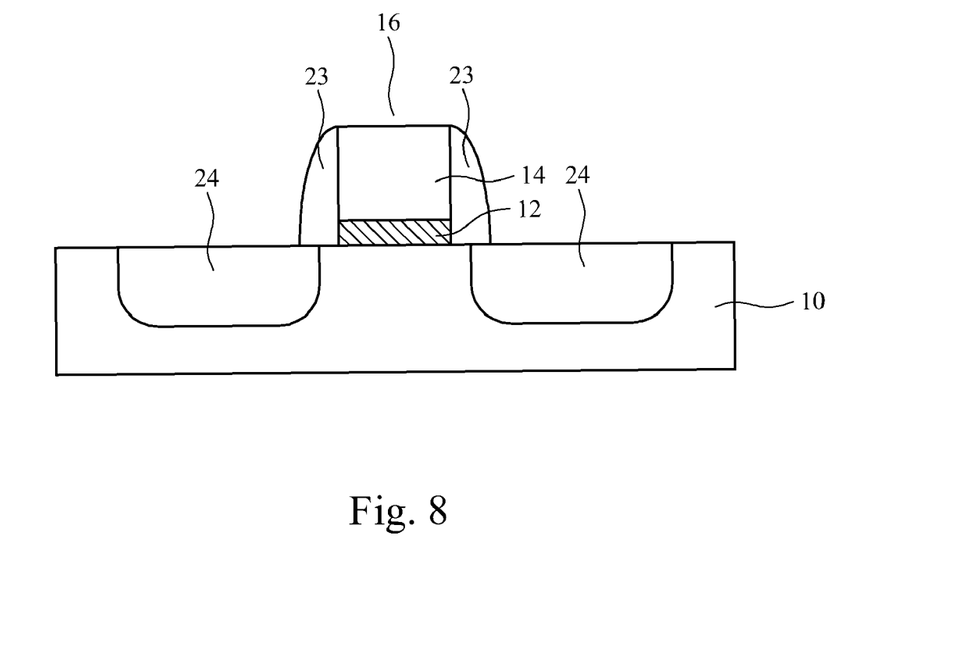

FIG. 7A illustrates the gate structure after the photo resist 22 is removed. FIG. 7B illustrates a top view of FIG. 7A. The BARC layer 13 is stripped after the device gate pattern is formed. Remaining elements of the MOS devices such as gate spacers, source and drain, etc. are formed using known methods, as shown in FIG. 8. A pair of spacers 23 is formed along the sidewalls of the gate dielectric 12 and gate electrode 14. Spacers 23 serve as self-aligning masks for subsequent source/drain formation steps, as described below. The spacers 23 may be formed by well-known methods such as blanket or selectively depositing a dielectric layer over regions including substrate 10 and gate structure 16, then anisotropically etching to remove the dielectric from the horizontal surfaces and leaving spacers 23. In the preferred embodiment, doping of the regions of substrate 10 on the side of spacers 23 may be performed to form part or the entire transistor source and drain regions 24. In other embodiments, other methods of forming source and drain regions 24 may be used.

Figure 9:
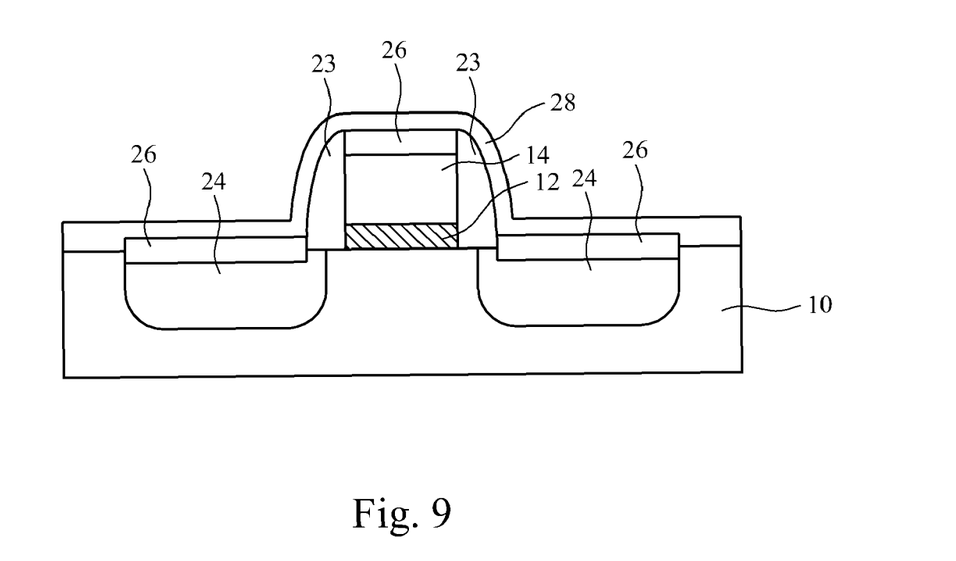

FIG. 9 illustrates formation of a silicide 26 and an etch stop layer (ESL) 28. Silicide 26 is formed over source and drain regions 24 and preferably over gate electrode 14 as well. In a preferred embodiment, silicide 26 is a metal silicide formed by first depositing a thin layer of metal, such as titanium, cobalt, nickel, tungsten, or the like, over the device, including the exposed surfaces of source and drain regions 24 and gate electrode 14. The device is then heated, which causes the silicide reaction to occur wherever the metal is in contact with the silicon. After reaction, a layer of metal nitride is formed between silicide and metal. The un-reacted metal is selectively removed through the use of an etchant that does not attack the silicide, $SiO_2$ and silicon substrate.

An etch stop layer (ESL) 28 is next blanket deposited over the device. ESL 28 may be formed using low-pressure chemical vapor deposition (LPCVD), but other CVD methods, such as plasma enhanced chemical vapor deposition (PECVD), and thermal CVD may also be used.

Figure 10:
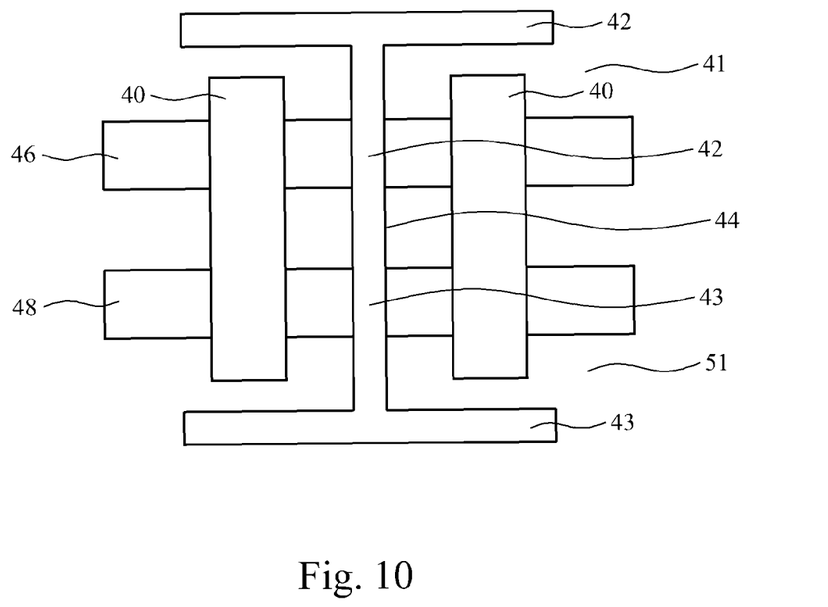
FIGS. 10 through 12 are top views of intermediate stages in the manufacture of another MOS transistor embodiment, wherein endcaps of two MOS devices are next to each other.
Figure 11:
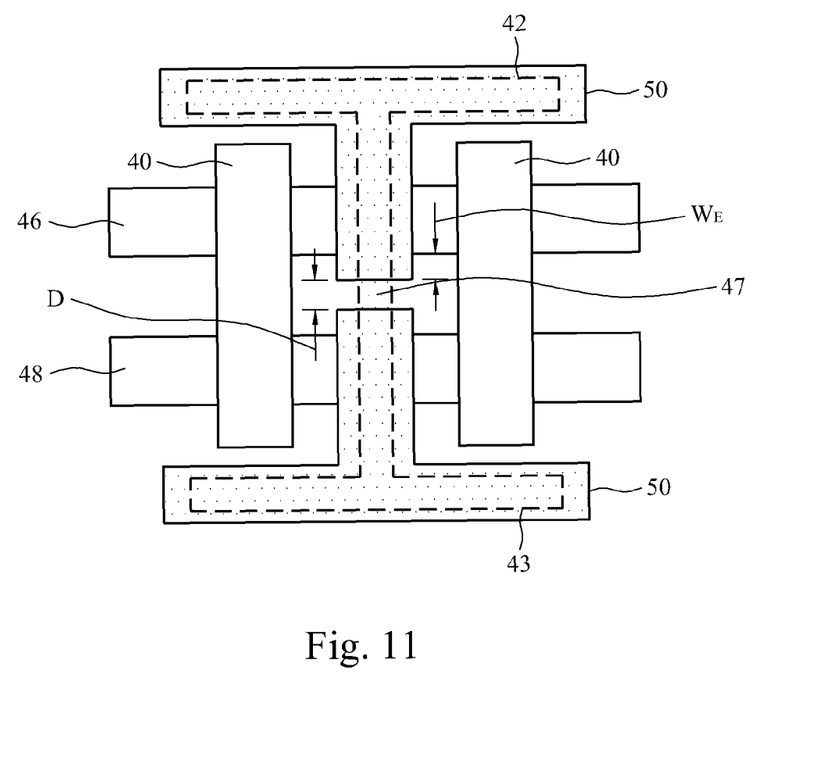
Figure 12:
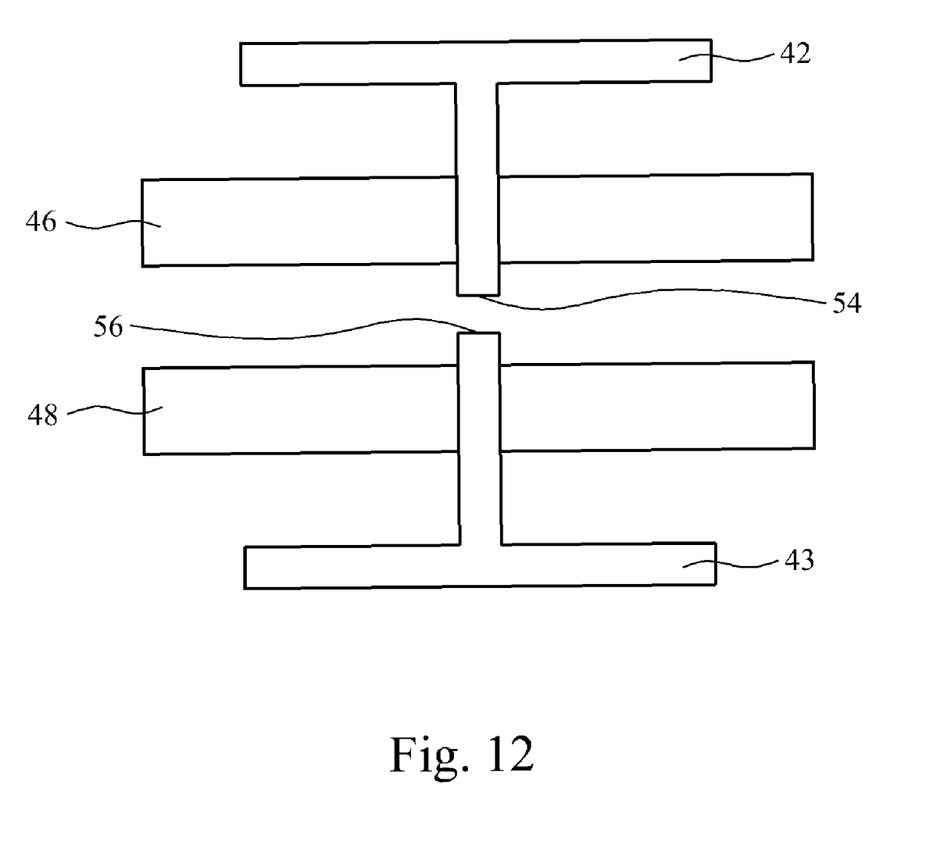

FIGS. 10 through 12 illustrate another preferred embodiment of the present invention. In some situations that the gate endcaps of two devices are closely located, as shown in FIG. 1. Problems such as bridging and poly line end shortening may occur, causing device failure or degradation. Therefore, gate endcap dimensions need to be controlled carefully.

FIG. 10 illustrates a top view of the preferred embodiment after the gate structures 42 and 43 and dummy patterns 40 are formed. The method for forming gates 42 and 43 and dummy patterns 40 has been described with reference to FIGS. 3 through 5 and will not be repeated in the present embodiment. A gate structure 42 for MOS device 41 is formed with at least a portion on a first active region 46. A gate structure 43 for MOS device 51 is formed with at least a portion on a second active region 48. The first and second active regions may actually be one active region or separated regions. Gate structures 42 and 43 are interconnected at point 44. As has been discussed, the introduction of dummy patterns into active regions improves the process so that the critical dimensions of the gates 42 and 43 are more closely on target. MOS devices 41 and 51 can be an nMOS-pMOS pair, two nMOS or two pMOS, or other combinations. Since dummy patterns 40 can be formed in active regions 46 and 48, device densities are more uniform and the deviation of the critical dimensions of gates 42 and 43 is controlled better.

FIG. 11 illustrates a photo resist 50 formed protecting the gate structures 42 and 43. Similar to the previously discussed embodiment, it is preferred that photo resist 50 extends beyond gates 42 and 43 for between about 10 nm and about 150 nm so that it is guaranteed that the gates 42 and 43 are completely covered. A gap 47 is formed between the photo resist covering gates 42 and 43. In the preferred embodiment, gap 47 has a width D of greater than about 50 nm, and more preferably between about 50 nm and about 500 nm, although the width D is a design consideration and can be changed according to the layout. In order to prevent over-etching through the gap 47 in the subsequent process steps causing gate ends recessing back into active regions 46 and 48, it is preferred that the photo resist 50 extends beyond active regions 46 and 48 for a distance $W_E$ of more than about 50 nm, more preferably more than about 200 nm.

Dummy patterns 40 are then etched and photo resist 50 is removed. The resulting structure after the photo resist 50 is removed is illustrated in FIG. 12. The connecting portion unprotected by the photo resist 50 is also etched and gates 42 and 43 are disconnected. By using this embodiment of the present invention, the endcaps 54 and 56 are controlled so that no bridging or end shortening occurs due to litho and etching.

The remaining elements of the MOS device such as spacers, source/drain, etc, are then formed. The forming process has been discussed in previous embodiment thus will not be repeated.

By using preferred embodiments of the present invention, the critical dimensions of the MOS devices are controlled. Typically, in an 80 nm technology, the deviation of the critical dimension is less than about 2 nm. Bridging and line end shortening are avoided. Due to more accurate dimension control with respect to design, N/P ratios are more controllable without using complicated fine tune techniques such as OPC and LPE. The overall chip speed and performance are improved. Although the preferred embodiments of the present invention only discusses the process of normal MOS devices, other MOS devices such as double gate transistors, lateral diffusion MOS can also benefit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming semiconductor structures, the method comprising the steps of:
   forming a gate dielectric layer over a substrate;
   forming a gate electrode layer over the gate dielectric layer;
   etching the gate electrode layer and the gate dielectric layer thereby forming a first gate structure, a second gate structure and dummy patterns, wherein at least a portion of the dummy patterns is directly overlying an active region, and wherein the first and second gate structures are interconnected by an interconnection portion;

forming a photo resist covering the first gate structure and the second gate structure, the photo resist having a gap exposing the interconnection portion between the first gate structure and the second gate structure, wherein the dummy patterns are not covered by the photo resist;

removing the interconnection portion by etching;

removing the dummy patterns by etching; and removing the photo resist.

2. The method of claim 1, wherein the dummy patterns have non-uniform spacing.

3. The method of claim 1 further comprising the steps of:

forming an anti-reflective coating (ARC) over the gate electrode layer before the first gate structure and the second gate structure are formed; and removing the ARC after the photo resist is removed.

4. The method of claim 3, wherein the ARC comprises a material selected from the group consisting essentially of an organic material and an in-organic material.

5. The method of claim 1, wherein the dummy patterns comprise the same material as the first and the second gate structures.

6. The method of claim 1, wherein the photo resist extends beyond edges of the first gate structure for between about 10 nm and about 150 nm in horizontal directions.

7. The method of claim 1, wherein the photo resist extends beyond edges of the second gate structure for between about 10 nm and about 150 nm in horizontal directions.

8. The method of claim 1, wherein the gap in the photo resist has a width of greater than about 50 nm.

9. A method for forming a semiconductor structure, the method comprising:

providing a semiconductor substrate comprising:

a first active region;

a second active region; and an insulating region separating the first and the second active region;

forming a gate strip extending over the first and the second active regions and the insulating region;

forming a dummy gate having a portion directly over at least one of the first and the second active regions, wherein the dummy gate is adjacent to the gate strip;

forming a photo resist having a first portion and a second portion, wherein the first portion of the photo resist covers a first portion of the gate strip over the first active region, and the second portion of the photo resist covers a second portion of the gate strip over the second active region, wherein at least a portion of the first and the second active regions are not covered by the photo resist, and wherein the first and the second portions of the photo resist have a gap directly over the insulating region;

removing the dummy gate by etching; and removing an interconnection portion of the gate strip exposed through the gap by etching.

10. The method of claim 9, wherein the first and the second active regions are parallel, and wherein the gate strip is a straight strip having a longitudinal direction perpendicular to a longitudinal direction of the first and the second active regions.

11. The method of claim 9, wherein the dummy gate extends over both the first and the second active regions.

12. The method of claim 11 further comprising an additional dummy gate on an opposite side of the gate strip than the dummy gate, wherein the additional dummy gate extends over both the first and the second active regions.

13. The method of claim 9, wherein the gap has a width of greater than about 50 nm.

14. The method of claim 9, wherein the first portion of the photo resist has an edge facing the second portion of the photo resist, and wherein a distance between the edge and a nearest edge of the first and the second active regions is greater than about 50 nm.

15. The method of claim 1, wherein the active region extends to directly underlie the first gate structure.

\* \* \* \* \*